United States Patent
Gulvin et al.

(10) Patent No.: US 8,097,497 B2
(45) Date of Patent: Jan. 17, 2012

(54) INKJET PRINTED WIREBONDS, ENCAPSULANT AND SHIELDING

(75) Inventors: Peter M. Gulvin, Webster, NY (US); Peter J. Nystrom, Webster, NY (US); John P. Meyers, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 530 days.

(21) Appl. No.: 11/694,886

(22) Filed: Mar. 30, 2007

(65) Prior Publication Data
US 2008/0242004 A1 Oct. 2, 2008

(51) Int. Cl.
*H01L 21/00* (2006.01)
(52) U.S. Cl. ........ 438/127; 438/126; 438/124; 438/106; 438/612; 438/666; 257/784
(58) Field of Classification Search .................. 438/127, 438/126, 124, 106, 612, 666; 257/784
See application file for complete search history.

(56) References Cited

U.S. PATENT DOCUMENTS

| | | | |
|---|---|---|---|
| 5,281,684 A * | 1/1994 | Moore et al. ................. | 427/97.5 |
| 2004/0004277 A1* | 1/2004 | Tsai et al. ..................... | 257/678 |
| 2004/0070085 A1* | 4/2004 | Hedler et al. ................. | 257/779 |
| 2007/0034997 A1* | 2/2007 | Bauer et al. .................. | 257/676 |
| 2007/0212813 A1* | 9/2007 | Fay et al. ...................... | 438/106 |

* cited by examiner

*Primary Examiner* — Junghwa M Im
(74) *Attorney, Agent, or Firm* — MH2 Technology Law Group LLP

(57) ABSTRACT

A method of connecting a chip to a package in a semiconductor device includes printing an encapsulant to a predetermined thickness on at least a portion of the chip and package and printing a layer of conductive material on the encapsulant in a predetermined pattern between the chip and package. The printed conductive material conforms to an upper surface of the encapsulant such that the encapsulant defines a distance from the printed conductive material to the chip and package. The method further includes printing a second layer of encapsulant over the printed conductive material curing at least the second layer of encapsulant.

17 Claims, 3 Drawing Sheets

INKJET PRINTED WIREBONDS, ENCAPSULANT AND SHIELDING

DESCRIPTION OF THE INVENTION

1. Field of the Invention

The present invention generally relates to wirebonding techniques, and more particularly, selective printing of wirebonds and spacers utilizing a materials printer.

2. Background of the Invention

Heretofore, in the fabrication of semiconductor devices, wirebonding is used to connect bond pads on a chip to bond pads on a package. More specifically, a wirebonding tool touches a pad on the chip, welding a wire to the pad, and then moving to a pad on the package while feeding a length of wire in the process. The wire is then welded at the other end thereof to the pad on the package. A path that the tool takes between the pads determines the shape and loop height of the wire, which can be important in many applications. For example, when multiple rows of pads are used to increase a density of connections, the loop heights must be controlled well enough to avoid shorting between the wires. This can be particularly important in applications such as an inkjet print head, where if the loop is too high, the wire can be damaged by the wiper blade used for maintaining the nozzle plate front face.

Examples of wirebonding techniques are illustrated in FIGS. 1A through 1C. In particular, FIG. 1A is an example of ball bonding wirebonding, FIG. 1B is an example of wedge bonding, and FIG. 1C illustrates an array of ball-bonded wires. Although most wirebonding techniques can apply an encapsulant to protect the wirebonding, encapsulation is omitted from the drawings for purposes of clearly illustrating the wirebonding. An encapsulant can be used to protect the wirebonding from environmental and physical factors known in the art.

In known fabrication of semiconductor devices of the type described above, an encapsulant is dispensed onto the wirebonds to prevent shorting, mechanical damage, environmental damage such as corrosion, and dielectric breakdown. Dispensing of encapsulant can present a problem by flowing into areas that interferes with device operation. In order to avoid this problem, a typical solution is to move the bond pads farther from the devices, thereby increasing die size and cost.

Another problem known in the art is that the wires can act as antennas, coupling unwanted energy from other devices or surrounding environment. When the wires act as antennas, noise is created in the circuit that can interfere with proper operation of the device.

Thus, there is a need to overcome these and other problems of the prior art by providing a method and apparatus for inkjet printed wires and encapsulant in a semiconductor device.

SUMMARY OF THE INVENTION

In accordance with the present teachings, a method of electrically connecting a substrate to a package of a semiconductor device is provided.

The exemplary method can include printing an encapsulant to a predetermined thickness on the substrate and package in a predetermined pattern, printing a layer of conductive wire on the encapsulant in a predetermined pattern between the substrate and package, and printing a second layer of encapsulant over the printed conductive wire pattern. The printed conductive wire conforms to an upper surface of the encapsulant and is thereby spaced from the substrate by a thickness of the encapsulant. At least the second layer of encapsulant can be cured.

In accordance with the present teachings, a method of forming wirebonds is provided.

The exemplary method can include printing a conductive metal material layer on a semiconductor device in a selective pattern, and spacing the printed metal material layer from a surface of the semiconductor device with a printed encapsulant material.

In accordance with the present teachings a wirebonded semiconductor device is provided.

The exemplary device can include a package and a chip fixed to the package. Each of the chip and package include a bond pad formed thereon. An insulating layer such as a dielectric or encapsulating layer is printed on an upper surface of the chip and package. A metal wire pattern is printed on an upper surface of the insulating layer and conforms to a surface thereof, the printed metal wire pattern being in contact with the chip bond pad and the package bond pad, the metal wire pattern spaced from the chip by a thickness of the first insulating layer. A second encapsulant layer can be printed on an upper surface of the metal wire pattern.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. However, one of ordinary skill in the art would readily recognize that the same principles are equally applicable to, and can be implemented in devices other than inkjet printers, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents. Wherever possible, the same reference numbers will be used throughout the drawings to refer to the same or like parts.

Embodiments pertain generally to printing of semiconductor components with a materials printer. Printed organic electronics, where materials are selectively deposited in a drop-by-drop pattern from an inkjet printer are known. The applications for such a device are typically used for large, relatively inexpensive electronics such as flat panel displays (LCD color filters and inter-color spacer, OLED displays), RFID tags, ubiquitous signage, smart paper, large photovoltaic cells, roll-up displays, printed circuit board etch and solder masks, and biological chemical sensors.

However, in the exemplary embodiments herein, encapsulant material and conductive metal material can be dispensed from a material printer having a piezoelectric print head in a precise and controlled manner to print bond pads, traces, wires, and encapsulant on any desired surface.

The piezoelectric print head as utilized herein, can be instructed to print a variety of materials such as metals and insulators at the direction of a programmed computer. Because the printing of materials is initially directed by a computer, any number of patterns can be printed, even independently of the material, thereby enabling layered semiconductor devices not previously achieved in the art.

Figures 1A, 1B:
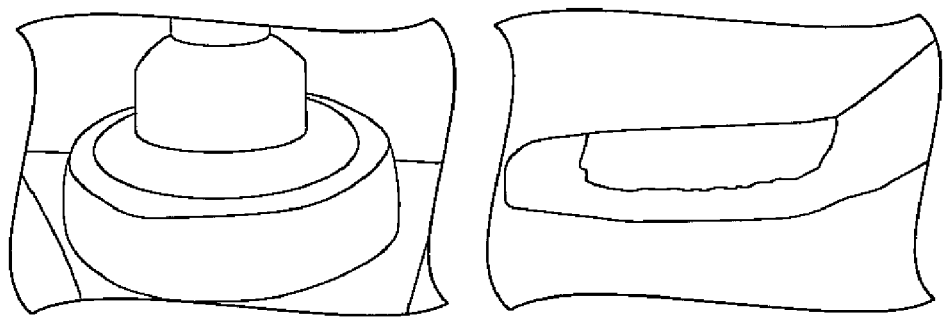
FIGS. 1A, 1B and 1C depict perspective views of known wirebonding.
Figure 1C:
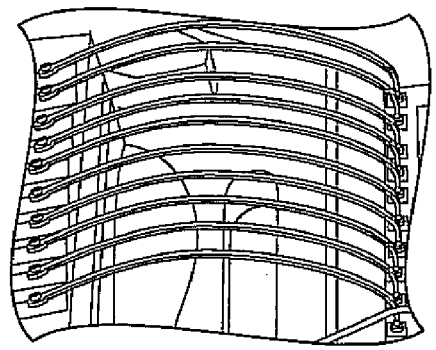
Figure 2:
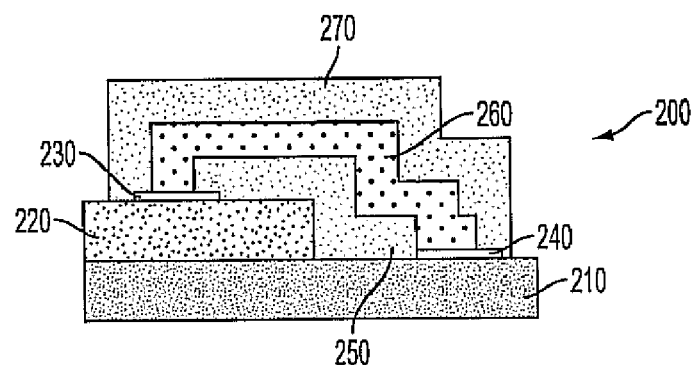
FIG. 2 illustrates a partial semiconductor device in accordance with embodiments of the present teachings.

FIG. 2 illustrates a semiconductor device 200 assembled by printing certain of the components with a materials type print head as will be described herein. It will be appreciated that the semiconductor device 200 represents a generalized schematic illustration and that other components may be added or existing components may be removed or modified. The assembled semiconductor device 200 can include a package 210, a substrate 220 formed on the package 210, bond pads 230, 240 for each of the substrate 220 and package 210, respectively, a first printed layer of encapsulant 250, a first printed layer of wire 260, and a second layer of printed encapsulant 270. Although not illustrated, traces can also be included in the device.

For purposes of describing the exemplary embodiments herein, the term "substrate" can refer to a die chip or the lice as known in the art. In addition, the term "wire" as used herein refers to the conductive metal printed by the print head and is not intended to limit the shape of file metal to that of a wire per se. Multiple layers of printed encapsulant and printed wire can be provided according to predetermined design parameters. Although not described in detail, one of skill in the art will appreciate the assembly can include a plurality of additional layers based on the description provided herein. In addition, it will become apparent from a reading of the following, that the interleaving of encapsulant enables wire patterns not previously obtained in the art.

Further, in connection with exemplary embodiments, use of encapsulants can be substituted with insulating or dielectric layers in certain contexts. Encapsulants, as used herein, can vary in composition, but are typically of a higher purity. In other words, the encapsulant can contain less ionic contaminants in order to reduce corrosion. By way of example only, encapsulants can be epoxy, gels, elastomers such as silicone, and other related materials. Encapsulants typically can be cured by heat, from about 60° C. to about 200° C. Encapsulants can also be cured by heat from about 125° C. to about 150° C. In addition, curing of encapsulants can be without heat, using, for example, a two part mix cure or other radiation such as ultraviolet light.

Turning now to FIGS. 3A through 3D, a process for assembling the semiconductor device 300 will be described. It will be appreciated that FIGS. 3A through 3D are simplified for the purposes of explanation and that other steps may added or existing components may be removed or modified.

Figure 3A:
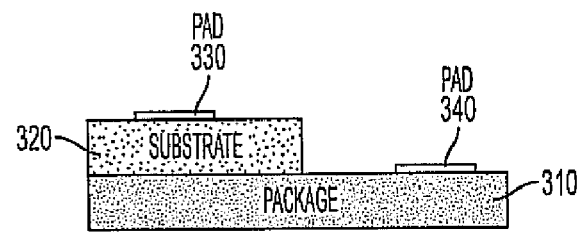
FIGS. 3A through 3D are side views depicting several stages of fabricating a semiconductor device with a materials print head in accordance with embodiments of the present teachings.

Referring first to FIG. 3A, an initial stage of assembly can include supply of the substrate 320 fixed to the package 310 and with bond pads 330, 340 previously fixed to each of the substrate 320 and package 310 respectively as shown. As indicated, traces (not shown) can be preexisting or they can be printed on the device with a print head 390 of a materials printer.

In the case where bond pads and traces are applied at the manufacturing site, application can be with the materials print head 390, similar to the encapsulant and wires. For example, the materials print head 390 can print drops of a colloidal conductor suspended in a volatile solvent, onto the substrate 320 and package 310. The substrate 320 and/or package 310 can be preheated, causing the solvent to flash evaporate upon contact therewith. Preheating the substrate 320 and package 310 can have the benefit of more quickly drying the printed material, while minimizing spreading of die material thereon. Typically, preheating of the substrate and package to a temperature between about 100° C. and about 300° C. will provide a surface temperature capable of flash evaporating the volatile solvent used. With the preheating, it is expected that a print drop of material can be formed to be about half the size of a similar print drop of material on a room temperature surface.

Examples of materials used for the colloidal conductor can include colloidal silver, colloidal gold, or other similar known conductors.

Thickness of the printed material defining the bond pads 330, 340 and traces can be controlled entirely by the print head 390. In other words, if a thicker layer of material is desired, additional drops are jetted onto the substrate at the same location. Sintering of the material can be performed after each print layer or after a number of material drops have been applied to the same location. If the substrate is heated to a high enough temperature, then a separate sintering step of the printed material may not be needed. In the event that sintering is used, it is expected that a 10 minute cycle at about 200° C. to about 300° C. will render a peak conductivity of the printed material. Even further, it is expected that a temperature of about 200° C. for silver and about 300° C. for gold can provide the peak conductivity described.

Figures 3B, 3C:
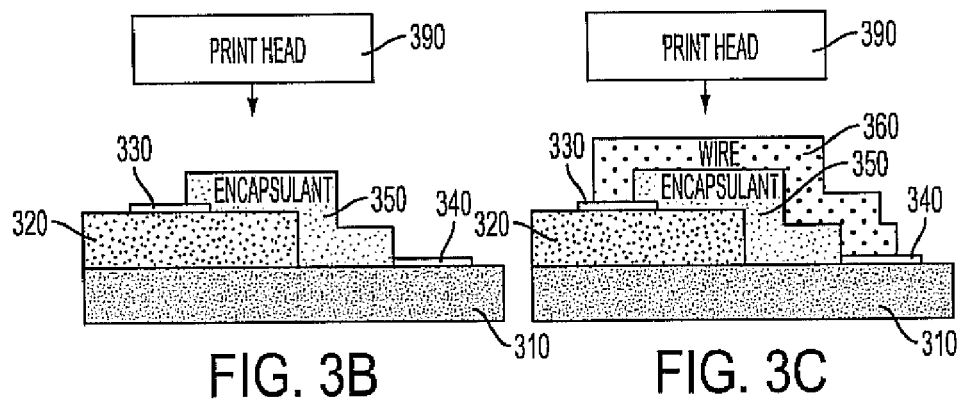
Figure 3D:
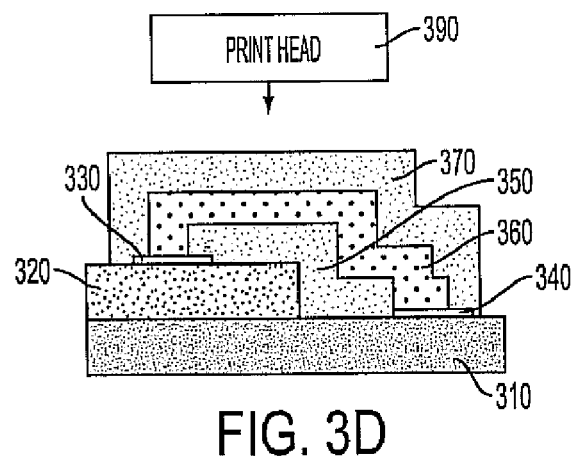

As depicted in FIG. 3B, the device can also include an encapsulant 350 printed onto at least the substrate 320 and package 310 with the materials print head 390. Although the encapsulant is depicted as being printed onto the substrate 320 and package 310, it will be appreciated that if the surfaces are insulating or dielectric, the first layer deposited by printing can be a metal defining the first layer of wire 360 as described further below. Thus, the "first layer of encapsulant" need not be the first layer printed onto the substrate and package.

In the event that encapsulant is printed over the substrate and package, the first layer of encapsulant 350 can be printed to a thickness corresponding to a desired distance between the substrate 320 and the first wire layer 360. The encapsulant 350 can overlap a portion of the substrate bond pad 330, and traverse a stepped structure between the substrate 320 and package 310 to terminate adjacent the package bond pad 340. It will be appreciated that the overlapping may only be provided if the substrate or structure in the non-bond pad region is conductive. If the substrate and package surface are dielectric, insulating, or provided with an insulating surface or layer, then the first layer of encapsulant can be omitted. If utilized, the printed encapsulant acts as an insulating spacer between the substrate 320 and an overlying wire 360 as will be further described herein, and can be printed to a desired thickness according to design parameters.

Typically, a printed layer of encapsulant 350 can be from about 1 to about 5 microns thick. The print head 390 can be about 1 mm away from the substrate 320 during printing;

however, the distance can be adjusted according to printing needs, for example, when printing on the package 310.

Once printed, the encapsulant can be fully cured using a bake. The temperature and duration of the bake can vary according to materials used for the encapsulant; however, a temperature of from about 100° C. to about 150° C. for about 30 minutes can be used as a basis. For a thin layer of encapsulant, a shorter bake time and/or temperature can be used, and for a thicker layer of encapsulant, a longer bake time and/or temperature can be used. In addition, step heights between the substrate 320 and the package 310 of approximately 600 microns can be accommodated by the print head 390.

As an option, when multiple layers of encapsulant and metal are printed on a device, a single bake can be performed upon completion of printing the various layers.

As depicted in FIG. 3C, a metal defining the first layer of wire 360 is printed over the first layer of encapsulant 350. In order to complete a conductive path, the first wire layer 360 is printed to contact both of the substrate bond pad 330 and the package bond pad 340. In an advance established by the exemplary embodiments, the path of the printed wire 360 between the bond pads 330, 340 can vary according to virtually any design parameter. The printed wire 360 conforms to an upper surface of the encapsulant upon which it is printed. In addition, the metal "wire" 360 can have a thickness defined by a number of superimposed printed drops, and of a width defined by a number of adjacent drops of the printed metal material.

Accordingly, the resulting printed wire 360 need not be round per se, but can be printed to any shape and dimension suitable for a particular device. For example, by constraining a vertical dimension of the printed wire 360, a microstrip type of line can be formed. Still further, if the printed wire 360 is intended to carry a large current, the wire can be printed to a size suitable for that current. The shape can also be changed to alter the wire's impedance, which can be important for reducing reflections in cases where the wires are acting as transmission lines. Even further, each of a plurality of wires within an array can be differently printed. Likewise, when the wire 360 will carry a large amount of current, such as a shared ground connection, it can be printed to have a large cross-section.

Thus, it will be appreciated that the printed wires 360 can come up a predetermined distance from the substrate 320, go directly sideways, drop over the edge and down to attach the bond pads to the package. Another wire could pass, for example, 5 µm above an existing wire without any danger of shorting, because the encapsulant 350 is printed before the top wire is printed. Wires can be used at a higher density than previously possible, particularly by printing multiple rows that travel laterally at different heights off the substrate 320. Wires can have "U" bends to relieve stress or balance the resistance between devices in an array. Further, since the encapsulant is only printed where it is needed, very little die space is needed to keep encapsulant away from devices. These examples are provided to illustrate the flexibility found by printing the wires in exemplary embodiments and are not intended to be limiting.

Once the wire 360 is printed, it can be sintered as described above in connection with the bond pads and traces. For example, sintering of the printed wire 360 can be at a temperature of about 200° C. to about 300° C. for about 10 minutes.

Subsequent to printing and any sintering of the printed wire 360, a second layer of encapsulant 370 is printed over the printed wire 360. Again, the encapsulant 370 can be cured in the same manner as described in connection with the first layer of encapsulant 350. If no additional layers of wire 360 are to be printed, then the function of the second layer of printed encapsulant 370 can be that of capping the printed wires 360 to protect them from each other and the environment. In the case where additional layers of printed wires will be applied, the second layer of encapsulant 370 can be an intermediate layer of encapsulant, used to define a thickness between adjacent layers of printed wires 360. It will be appreciated that printing of encapsulant and wire layers can be repeated according to a desired number of wiring layers for a particular device.

Although not specifically illustrated, it will be also be appreciated that a metal layer can be printed as an electromagnetic interference (EMI) shield to isolate the wires. This can be applicable particularly in higher frequency operations, or for applications in electrically noisy areas. If it is desired to prevent electrical cross-talk between devices, a metal shroud can be made to surround individual wires. Even further, each wire can be individually encapsulated.

Figure 4:
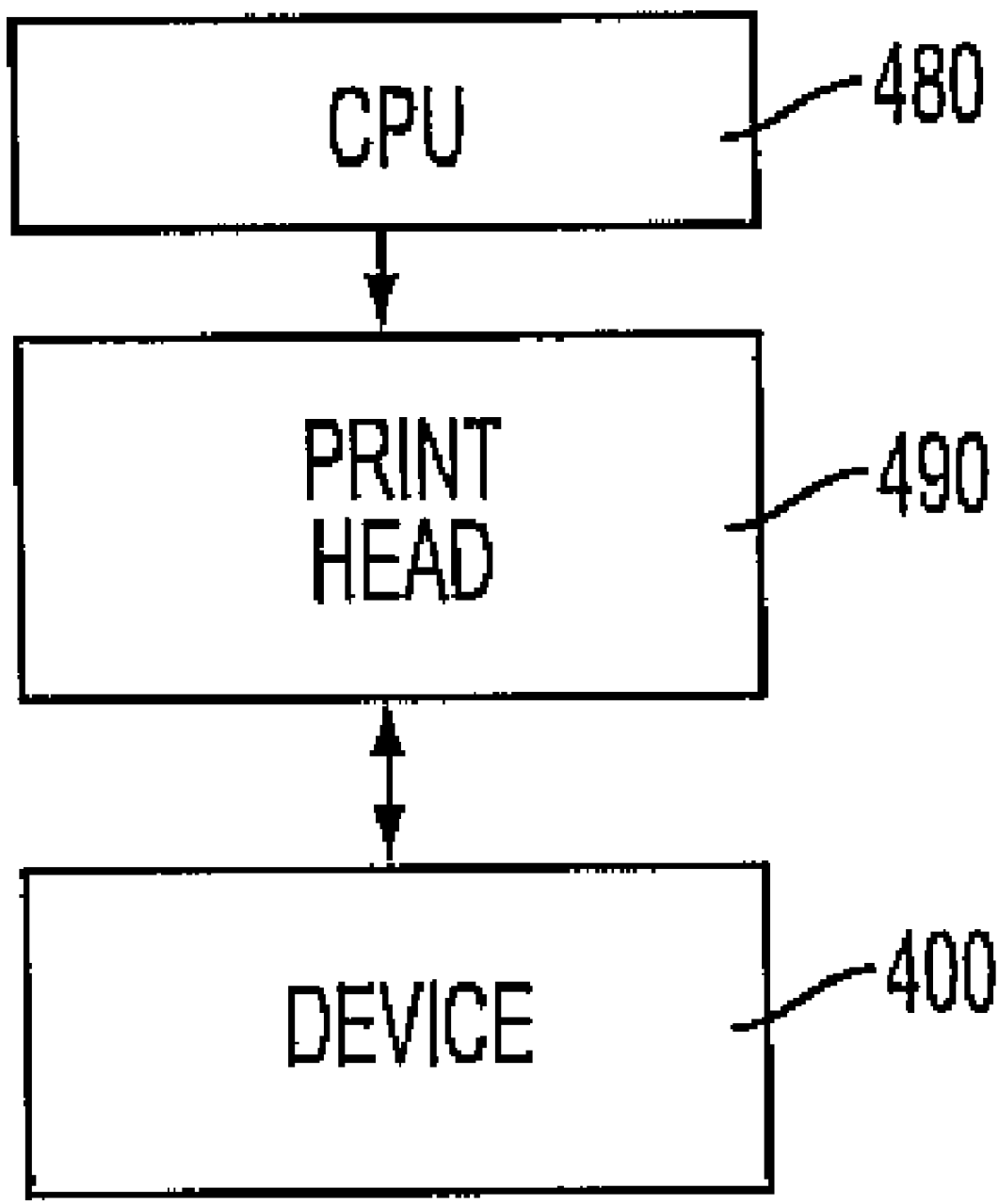
FIG. 4 illustrates an interconnection of operative components in accordance with embodiments of the present teachings.

FIG. 4 is provided to illustrate the interconnection of operative components in accordance with embodiments of the present teachings. More specifically, a computer having a programmable central processing unit is programmed to instruct a type and location of print material to be ejected from the materials print head 490 onto the device 400. Varying the print locations, amount, and patterns is controlled according to an input into and resulting application of the computer. Although the relationships of components are described in general terms, it will be appreciated by one of skill in the art can add, remove, or modify certain components without departing from the scope of the exemplary embodiments.

It will be appreciated by those of skill in the art that several benefits are achieved by the exemplary embodiments described herein and include a wide variety of applications, shape control, high wire density, control over wire shape and diameter, ease of wire routing, and overall process simplification. For example, the wires as described herein can be printed onto almost any type of device that currently uses standard wirebonds, whether or not the devices themselves were created by a materials printer. The shape control feature allows nearly complete three-dimensional control over wire shape, thus enabling wire crossovers, prevention of shorting, and maintaining a low loop height. The low loop height can be particularly advantageous in applications where the vertical dimensions are constrained, such as in avoiding a wiper blade of an inkjet head, or high-density interconnections.

Further, materials printers can print wires as small as 25 µm with spacing of 25 µm, allowing a wire pitch of 50 µm for a single row. Adding additional rows of bond pads and wires can allow the effective pitch to be even smaller, on the order of 12.5 µm for four rows. Each row in from an edge of the device can be formed at a higher elevation (using printed encapsulant) than the previous wire, so that it doesn't interfere with other rows.

Further, there are situations where large numbers of wires are not currently used because of the correspondingly large number of connections required. By using a materials printer with a large number of jets, many wires can be printed simultaneously without any time constraints. Also, an extremely large number of standard wirebonds can be impractical due to the risk of failures, and printing of the wires can avoid this problem and provide a higher accuracy than with standard wirebonding technologies.

In addition, different lengths of wires have different resistances, which can cause problems for some applications that require all devices to perform identically. With traditional wirebonding, this can be addressed by changing loop height, but it can be difficult to determine the ideal loop height, the ideal path for the bonder to take to generate that loop height, and to ensure that the bonder is consistently repeating the process. It will therefore be appreciated that the printed wires of the exemplary embodiments herein can easily take longer or shorter routes or can have added loops included to increase resistance of the wire. The cross-section of wires can also be changed to equalize the resistance, with larger cross-sectional area giving smaller resistances.

While the invention has been illustrated with respect to one or more exemplary embodiments, alterations and/or modifications can be made to the illustrated examples without departing from the spirit and scope of the appended claims. In particular, although the method has been described by examples, the steps of the method may be performed in a different order than illustrated or simultaneously. In addition, while a particular feature of the invention may have been disclosed with respect to only one of several embodiments, such feature may be combined with one or more other features of the other embodiments as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." And as used herein, the term "one or more of" with respect to a listing of items such as, for example, "one or more of A and B," means A alone, B alone, or A and B.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any an all sub-ranges between (and including) the minimum value of zero and the maximum value of 10, that is, any and all sub-ranges having a minimum value of equal to or greater than zero and a maximum value of equal to or less than 10, e.g., 1 to 5.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A method of connecting a chip to a package in a semiconductor device comprising:
  printing bond pads on the chip and package;
  printing a first layer of encapsulant to a predetermined thickness on at least a portion of the chip and package, the printed first layer of encapsulant also overlapping a portion of the chip bond pad;
  using a material printer comprising a piezoelectric print head, selectively ink jet printing a layer of conductive material on the first layer of encapsulant in a predetermined pattern between the chip and package, wherein the printed conductive material layer is shape controlled in three dimensions and conforms to an upper surface of the first layer of encapsulant such that the first layer of encapsulant defines a spacing between the printed conductive material and the chip and package;
  printing a second layer of encapsulant over the ink jet printed conductive material; and
  curing at least the second layer of encapsulant,
  wherein at least one of the first layer of encapsulant and the second layer of encapsulant is printed using a material printer comprising a piezoelectric print head.

2. The method according to claim 1, wherein printing bond pads comprises preheating the device and printing drops of a conductor suspended in a volatile solvent to the preheated device, and flash evaporating the volatile solvent upon contact with the preheated device.

3. The method according to claim 2, wherein the conductor is colloidal silver.

4. The method according to claim 2, wherein the conductor is colloidal gold.

5. The method according to claim 2, wherein preheating the device is to a temperature of about 50 to about 300° C.

6. The method according to claim 1, further comprising sintering the printed bond pads.

7. The method according to claim 6, wherein sintering the printed conductive material comprises heating for about 10 minutes at a temperature of about 200° C. to about 300° C.

8. The method according to claim 1, further comprising curing at least one of the first layer of encapsulant and the second layer of encapsulant at a temperature of about 100° C. to about 150° C. for about 30 minutes.

9. The method according to claim 1, wherein printing is controlled by a programmable computer.

10. The method according to claim 1, wherein printing is by a materials printer.

11. The method according to claim 1, wherein a path of the printed conductive material layer is continually adjustable.

12. The method according to claim 1, wherein the encapsulant and conductive metal layers are stacked to include four conductive metal layers.

13. The method according to claim 1, wherein impedance of the semiconductor device is controlled according to a position and number of printed conductive metal layers.

14. The method according to claim 1, wherein each layer is about 1 to about 5 microns.

15. The method of claim 1, further comprising:
  printing the bond pads on the chip and package using a material printer comprising a piezoelectric print head.

16. The method of claim 15, further comprising:
  printing an epoxy during the printing of at least one of the first layer of encapsulant and the second layer of encapsulant using a material printer comprising a piezoelectric print head.

17. The method of claim 16, further comprising:
  printing both the first layer of encapsulant and the second layer of encapsulant using a material printer comprising a piezoelectric print head.

* * * * *